US009899200B2

(12) United States Patent
Giles et al.

(10) Patent No.: US 9,899,200 B2
(45) Date of Patent: Feb. 20, 2018

(54) MULTI-DIMENSIONAL ION SEPARATION

(71) Applicant: MICROMASS UK LIMITED, Wilmslow (GB)

(72) Inventors: Kevin Giles, Stockport (GB); Jason Lee Wildgoose, Stockport (GB)

(73) Assignee: MICROMASS UK LIMITED, Wilmslow (GB)

(*) Notice: Subject to any disclaimer, the term of this patent is extended or adjusted under 35 U.S.C. 154(b) by 0 days.

(21) Appl. No.: 15/310,694

(22) PCT Filed: May 13, 2015

(86) PCT No.: PCT/GB2015/051401
§ 371 (c)(1),
(2) Date: Nov. 11, 2016

(87) PCT Pub. No.: WO2015/173562
PCT Pub. Date: Nov. 19, 2015

(65) Prior Publication Data

US 2017/0076929 A1 Mar. 16, 2017

(30) Foreign Application Priority Data

May 13, 2014 (EP) .................................... 14168128
May 13, 2014 (GB) .................................. 1408455.2

(51) Int. Cl.
*H01J 49/06* (2006.01)
*H01J 49/26* (2006.01)
(Continued)

(52) U.S. Cl.
CPC .......... *H01J 49/065* (2013.01); *H01J 49/004* (2013.01); *H01J 49/0027* (2013.01); *H01J 49/40* (2013.01)

(58) Field of Classification Search
USPC ................................ 250/281–283, 290, 291
See application file for complete search history.

(56) References Cited

U.S. PATENT DOCUMENTS 2,471,935 A 5/1949 Coggeshall et al.
5,869,831 A 2/1999 De La Mora et al.
(Continued)

FOREIGN PATENT DOCUMENTS

EP 1923699 5/2008
EP 2037253 3/2009
(Continued)

*Primary Examiner* — Bernard Souw

(57) ABSTRACT

A sub-ambient gas pressure ion separation device is disclosed comprising: an ion entrance aperture having an axis therethrough that extends in a first direction, and an ion exit aperture; wherein the entrance aperture and exit aperture are spatially separated from each other in the first direction and in a second, orthogonal direction; and means for urging ions in said second direction as the ions travel in the first direction, said means for causing ions to separate in said second direction according to a physicochemical property such that ions having a first value, or first range of values, of the physicochemical property exit the device through the exit aperture and other ions having a different value, or different range of values, of said physicochemical property do not exit the device through the exit aperture.

21 Claims, 3 Drawing Sheets

(51) Int. Cl.

| | |
|---|---|
| ***H01J 49/00*** | (2006.01) |
| ***B01D 59/44*** | (2006.01) |
| ***G01N 27/62*** | (2006.01) |
| ***H01J 49/40*** | (2006.01) |

(56) References Cited

U.S. PATENT DOCUMENTS

| | | | | |
|---|---|---|---|---|
| 6,690,004 | B2 | 2/2004 | Miller et al. | |
| 6,917,036 | B2 | 7/2005 | Guevremont et al. | |
| 7,112,788 | B2 | 9/2006 | Guevremont et al. | |
| 7,576,321 | B2 | 8/2009 | Wu | |
| 7,858,927 | B2 | 12/2010 | Thomson | |
| 8,232,519 | B2 | 7/2012 | De La Mora et al. | |
| 8,344,316 | B2 * | 1/2013 | Green | H01J 49/4265 250/282 |
| 8,354,634 | B2 * | 1/2013 | Green | H01J 49/40 250/252.1 |
| 8,378,297 | B2 | 2/2013 | Vidal-De-Miguel | |
| 8,426,802 | B2 | 4/2013 | Giles et al. | |
| 8,445,845 | B2 * | 5/2013 | Green | H01J 49/4265 250/281 |
| 8,492,708 | B2 | 7/2013 | Wu | |
| 8,507,852 | B2 | 8/2013 | Makarov | |
| 8,698,076 | B2 | 4/2014 | Orii et al. | |
| 8,735,808 | B2 * | 5/2014 | Denny | H01J 49/40 250/282 |
| 8,754,364 | B2 * | 6/2014 | Green | H01J 49/40 250/252.1 |
| 8,921,803 | B2 | 12/2014 | Welkie | |
| 8,941,054 | B2 | 1/2015 | Park et al. | |
| 8,941,056 | B2 * | 1/2015 | Green | H01J 49/40 250/252.1 |
| 8,975,578 | B2 | 3/2015 | Green et al. | |
| 9,383,338 | B2 * | 7/2016 | Green | H01J 49/0009 |
| 9,404,955 | B2 * | 8/2016 | Green | G01R 29/26 |
| 9,460,902 | B2 * | 10/2016 | Wildgoose | H01J 49/0031 |
| 9,564,301 | B2 * | 2/2017 | Green | G01R 29/26 |
| 9,576,781 | B2 * | 2/2017 | Green | H01J 49/0031 |
| 9,711,337 | B2 * | 7/2017 | Green | H01J 49/0036 |
| 9,721,779 | B2 * | 8/2017 | Hoyes | H01J 49/401 |
| 9,728,391 | B2 * | 8/2017 | Hoyes | H01J 49/401 |
| 2003/0089847 | A1 | 5/2003 | Guevremont et al. | |
| 2009/0057546 | A1 | 3/2009 | Giles | |
| 2015/0170897 | A1 * | 6/2015 | Hoyes | H01J 49/401 250/282 |
| 2016/0035551 | A1 * | 2/2016 | Green | H01J 49/0031 250/282 |
| 2016/0254129 | A1 * | 9/2016 | Richardson | H01J 49/0031 250/282 |
| 2016/0274058 | A1 * | 9/2016 | Wildgoose | H01J 49/0031 |
| 2017/0032951 | A1 * | 2/2017 | Hoyes | H01J 49/406 |
| 2017/0110303 | A1 * | 4/2017 | Giles | H01J 49/0031 |
| 2017/0122907 | A1 * | 5/2017 | Green | G01N 27/624 |
| 2017/0125224 | A1 * | 5/2017 | Wildgoose | H01J 49/0045 |
| 2017/0178880 | A1 * | 6/2017 | Wildgoose | H01J 49/0027 |
| 2017/0250062 | A1 * | 8/2017 | Green | H01J 49/0036 |

FOREIGN PATENT DOCUMENTS

| | | |
|---|---|---|
| GB | 1518282 | 7/1978 |
| GB | 2485063 | 5/2012 |
| JP | 1111264790 | 9/1999 |
| WO | 2005/067000 | 7/2005 |
| WO | 2005/106450 | 11/2005 |

* cited by examiner

MULTI-DIMENSIONAL ION SEPARATION

CROSS-REFERENCE TO RELATED APPLICATIONS

This application represents the U.S. National Phase of International Application No. PCT/GB2015/051401 entitled "Multi-Dimensional Ion Seperation" filed 13 May 2015, which claims priority from and the benefit of United Kingdom patent application No. 1408455.2 filed on 13 May 2014 and European patent application No. 14168128.8 filed on 13 May 2014. The entire contents of these applications are incorporated herein by reference.

BACKGROUND TO THE PRESENT INVENTION

The present invention relates to an ion separation device for separating ions according to at least one physicochemical property.

Conventional gas phase separation devices provide separation in a single dimension at any one time.

It is desired to provide an improved ion separation device and an improved method of separating ions.

SUMMARY OF THE PRESENT INVENTION

The present invention provides an ion separation device configured to operate at sub-ambient gas pressure comprising:

an ion entrance aperture having an axis therethrough that extends in a first direction, and an ion exit aperture; wherein the entrance aperture and exit aperture are spatially separated from each other in the first direction and in a second, orthogonal direction;

means for urging ions through the device in said first direction; and means for urging ions in said second direction for causing ions to separate in said second direction according to a first physicochemical property such that ions having a first value, or first range of values, of the physicochemical property exit the device through the exit aperture and other ions having a different value, or different range of values, of said physicochemical property do not exit the device through the exit aperture.

The embodiments of the present invention relate to an ion guiding device arranged to provide flow through ion separation in one or more orthogonal spatial directions. This enables ions to be separated and selectively transmitted, e.g. for subsequent analysis or detection, whilst increasing speed of selection and reducing the footprint of the instrument as compared to conventional, sequential, separation devices. Operation of the device at sub-ambient gas pressures allows fuller manipulation and control of the ions and their separations.

It is known to analyse ions in a Differential Mobility Analyser (DMA). For example, U.S. Pat. No. 5,869,831 discloses a DMA device in which ions are driven through an ion separation chamber by a DC voltage gradient, whilst a well defined gas flow is provided perpendicular to the voltage gradient, such that the ions are separated according to their mobility through the gas. An exit orifice is provided in the chamber such that only some of the separated ions reach the exit. The mobility of the ions transmitted through the exit orifice can then be determined from the DC voltage gradient and the gas flow. However, this and similar analysers are operated at atmospheric pressure. This is because these analysers are essentially derivatives of particle sizers and as such these instruments need not be coupled to mass spectrometer systems and hence no vacuum is required to been present. U.S. Pat. No. 5,869,831 does not disclose or suggest operating the analyser at sub-ambient pressures, as required by the present invention, since U.S. Pat. No. 5,869,831 does not recognise that operation of the device at sub-ambient gas pressures allows fuller manipulation and control of the ions and their separations FAIMS analysers are also known that use a gas flow to drive ions through the analyser, such as that in U.S. Pat. No. 2003/0150987. However, such analysers also operate at atmospheric pressure and do not recognise that operation of the device at sub-ambient gas pressures allows fuller manipulation and control of the ions and their separations.

Said sub-ambient gas pressure is a pressure lower than atmospheric pressure and may also be selected from the group consisting of: $\geq 10^{-4}$ mbar; $\geq 5\times10^{-4}$ mbar; $\geq 10^{-3}$ mbar; $\geq 5\times10^{-3}$ mbar; $\geq 10^{-2}$ mbar; between $10^{-4}$ mbar and $10^{-1}$ mbar; between $10^{-4}$ mbar and $10^{-2}$ mbar; $\leq 10^{-1}$ mbar; $\leq 5\times10^{-2}$ mbar; $\leq 10^{-2}$ mbar; $\leq 5\times10^{-3}$ mbar; and $\leq 10^{-3}$ mbar.

The means for urging ions in said first direction may cause no ion separation in said first direction. The means for urging ions in the first direction may not cause ions to be separated according to a physicochemical property in the first direction. Alternatively, although less desirable, ions may be urged in the first direction so as to be caused to separate according to a, or the, physicochemical property in the first direction. Ions may be caused to separate according to one physicochemical property in the first direction and another physicochemical property in the second direction.

The device may be configured such that there is substantially no gas flow through the device; and/or such that ions are not driven through the device by a gas flow. This is different to conventional DMA and FAIMS devices, which require laminar gas flows through the devices in order to maintain reasonable resolution. In contrast to such conventional devices, the device of the present invention may have no bulk gas flow through the device.

The device may comprise one or more RF voltage supply arranged and configured so as to apply RF voltages to the device so as to confine ions within the device in at least one dimension. The sub-ambient pressure of the device allows the use of the RF confinement.

Ions having different first physicochemical property values may be driven in the second direction at different rates. Different ions may be caused to travel in said first and/or second directions at different rates such that said ions having said first value, or first range of values, of said physicochemical property arrive at and pass through the exit aperture, whereas ions having said different physicochemical property value(s) do not arrive at the exit aperture.

The device may comprise means for confining ions in said device in a third direction that is orthogonal to said first and second directions by applying RF and/or DC voltages to said device.

The entrance aperture may be spaced from the exit aperture in the first direction, in the second direction and in a third direction that is orthogonal to both said first and second directions; wherein the device comprises means for urging ions within the device in the third direction; and (i) wherein, in use, said means for urging ions in the third direction causes ions to separate in said third direction according to a second, different physicochemical property such that ions having a first value, or first range of values, of the second physicochemical property exit the device through the exit aperture and other ions having a different value, or different range of values, of said second physicochemical property do not exit the device through the exit aperture; or (ii) wherein, in use, said means for urging ions in the second and third directions both cause ions to separate according to the same, first physicochemical property but at different rates and such that ions having a first value, or first range of values, of the first physicochemical property exit the device through the exit aperture and other ions having a different value, or different range of values, of said first physicochemical property do not exit the device through the exit aperture.

The device may comprise means for urging ions through the device in said first direction, wherein said means for urging ions in said first direction, said means for urging ions in said second direction and said means for urging ions in said third direction either: (i) cause ions having a first combination of values for said first and second physicochemical properties to exit the device through the exit aperture and other ions having a second, different combination of values for said first and second physicochemical properties not to exit the device through the exit aperture; or (ii) cause ions having a first value or first range of values of the first physicochemical property to exit the device through the exit aperture and other ions having a different value or different range of values of said first physicochemical property not to exit the device through the exit aperture.

Different types of ions may be caused to travel in said first and/or second and/or third directions at different rates such that some of said ions arrive at and pass through the exit aperture, whereas other, different types of ions do not arrive at the exit orifice.

The device may be configured such that ions are simultaneously separated in the first and second directions, or in the second and third directions, or in all of the first, second and third direction.

The exit aperture may be arranged in a wall of the device such that ions that are not transmitted through the exit aperture collide with said wall.

The wall may be an electrode, such as an electrode plate.

The device may comprise control means for varying the force with which ions are urged in the first and/or second and/or third directions with time such that ions having different values of said first and/or second physicochemical property exit a given exit aperture at different times.

A detector may be provided downstream of the exit aperture. A processor may be used to determine the value of the first and/or second physicochemical property of ions detected at the detector from the force with which these ions are urged in the first and/or second and/or third directions, and optionally from the time that these ions entered the entrance aperture.

The device may comprise a further exit aperture that is coaxial with the entrance aperture for allowing ions to pass from the entrance aperture to the further exit aperture in a substantially straight line.

The device may comprise multiple exit apertures that are spaced apart from the entrance aperture in the first direction, and: i) wherein the multiple exit apertures are spaced apart from the entrance aperture by different distances in the second direction: and/or ii) wherein the multiple exit apertures are spaced apart from the entrance aperture by different distances in the third direction orthogonal to said first and second directions; and/or iii) wherein at least one of the multiple exit apertures is spaced apart from the entrance aperture in the second direction and at least one other of the multiple exit apertures is spaced apart from the entrance aperture in the third direction.

A control means may vary or select the force(s) with which ions are urged in the first and/or second and/or third directions such that ions are caused to exit a selected one of the multiple apertures. For example, ions may be caused to separate in the second direction only and exit one of the exit apertures. Alternatively, or subsequently, ions may be caused to separate in the second and third directions and exit a different exit aperture.

The device may comprise control means for varying the force with which ions are urged in the first and/or second and/or third directions with time such that ions having the same value of said first and/or second physicochemical property exit different exit apertures at different times.

The driving force in the first direction preferably substantially only has a component in the first direction.

The separating force in the second direction preferably substantially only has a component in the second direction.

The separating force in the third direction preferably substantially only has a component in the third direction.

The first direction may be coaxial with entrance aperture.

The axis through the entrance aperture may be substantially parallel to the axis through the exit aperture or the axis through at least one of the exit apertures. For example, ions may enter the device through an aperture in an entrance wall and may exit the device through at least one aperture in a substantially parallel, opposing exit wall.

However, it is also contemplated that the axis through the entrance aperture may be at an angle other than parallel to the axis through the exit aperture or the axis through at least one of the exit apertures. For example, the axes may be orthogonal to each other.

Ions may enter the separation device in the first direction and may exit the device in the second direction through one or more of the exit apertures. For example, ions may enter the device through an aperture in an entrance wall and may exit the device through at least one aperture in a wall that is arranged in a plane defined by the first and third directions.

Additionally, or alternatively, ions may enter the separation device in the first direction and may exit the device in the third direction through one or more of the exit apertures. For example, ions may enter the device through an aperture in an entrance wall and may exit the device through a wall that is arranged in a plane defined by the first and second directions.

The first physicochemical property may be ion mobility and ions may separate in the first and/or second and/or third direction according to their ion mobility. Alternatively, the ions may be separated in the first and/or second and/or third directions according to different separation techniques, said different separation techniques optionally being selected from the list consisting of: low electric field ion mobility separation; high electric field ion mobility separation; differential mobility separation; and ion mobility separation by driving the ions through a gas using a transient potential barrier.

Less preferably, the ions may be separated according to their mass to charge ratio in the first and/or second and/or third direction.

The device may comprise means for driving ions in the first direction by travelling one or more DC voltage in the first direction.

Additionally, or alternatively, the device may comprise means for driving ions in the first direction by applying a static DC potential gradient in the first direction.

The device may receive a continuous beam of ions from a source of ions, or may alternatively receive packets of ions, e.g. from an ion trap.

The device may be gas-filled and is operated at a pressure below atmospheric pressure. However, it is contemplated that the device may be operated at pressures equal to or above ambient or atmospheric pressure.

An ion detector and/or ion analyser, such as a mass analyser or ion mobility analyser, may be provided downstream of the device for detecting or analysing ions exiting the device.

The present invention also provides an ion mobility spectrometer or a mass spectrometer comprising an ion separation device as described herein.

The spectrometer may comprise a detector, ion trap, mass analyser or ion mobility analyser arranged downstream of the ion separation device.

The present invention also provides a method of separating ions at sub-ambient gas pressure using the ion separation device described herein. The method may comprise urging ions in said first direction, and urging ions in said second direction as the ions travel in the first direction such that ions separate in said second direction according to a physicochemical property and so that ions having a first value, or first range of values, of the physicochemical property exit the device through the exit aperture and other ions having a different value, or different range of values, of said physicochemical property do not exit the device through the exit aperture.

The method may comprise any of the method steps described herein in relation to the ion separation device.

The present invention also provides a method of ion mobility spectrometry or mass spectrometry comprising the method of separating ions described herein.

The method may further comprise detecting, trapping, mass analysing or ion mobility analysing ions downstream of the ion separation device or using the ion separation device.

The spectrometer described herein may comprise:

(a) an ion source selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray Ionisation ("LSI") ion source; (xxiv) a Sonicspray Ionisation ("SSI") ion source; (xxv) a Matrix Assisted Inlet Ionisation ("MAII") ion source; (xxvi) a Solvent Assisted Inlet Ionisation ("SAII") ion source; (xxvii) a Desorption Electrospray Ionisation ("DESI") ion source; and (xxviii) a Laser Ablation Electrospray Ionisation ("LAESI") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic mass analyser arranged to generate an electrostatic field having a quadro-logarithmic potential distribution; (x) a Fourier Transform electrostatic mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter; and/or (k) a device or ion gate for pulsing ions; and/or (l) a device for converting a substantially continuous ion beam into a pulsed ion beam.

The spectrometer may comprise either:

(i) a C-trap and a mass analyser comprising an outer barrel-like electrode and a coaxial inner spindle-like electrode that form an electrostatic field with a quadro-logarithmic potential distribution, wherein in a first mode of operation ions are transmitted to the C-trap and are then injected into the mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

The spectrometer may comprise a device arranged and adapted to supply an AC or RF voltage to the electrodes. The AC or RF voltage preferably has an amplitude selected from the group consisting of: (i) <50 V peak to peak; (ii) 50-100 V peak to peak; (iii) 100-150 V peak to peak; (iv) 150-200 V peak to peak; (v) 200-250 V peak to peak; (vi) 250-300 V peak to peak; (vii) 300-350 V peak to peak; (viii) 350-400 V peak to peak; (ix) 400-450 V peak to peak; (x) 450-500 V peak to peak; and (xi) >500 V peak to peak.

The AC or RF voltage preferably has a frequency selected from the group consisting of: (i) <100 kHz; (ii) 100-200 kHz; (iii) 200-300 kHz; (iv) 300-400 kHz; (v) 400-500 kHz; (vi) 0.5-1.0 MHz; (vii) 1.0-1.5 MHz; (viii) 1.5-2.0 MHz; (ix) 2.0-2.5 MHz; (x) 2.5-3.0 MHz; (xi) 3.0-3.5 MHz; (xii) 3.5-4.0 MHz; (xiii) 4.0-4.5 MHz; (xiv) 4.5-5.0 MHz; (xv) 5.0-5.5 MHz; (xvi) 5.5-6.0 MHz; (xvii) 6.0-6.5 MHz; (xviii) 6.5-7.0 MHz; (xix) 7.0-7.5 MHz; (xx) 7.5-8.0 MHz; (xxi) 8.0-8.5 MHz; (xxii) 8.5-9.0 MHz; (xxiii) 9.0-9.5 MHz; (xxiv) 9.5-10.0 MHz; and (xxv) >10.0 MHz.

The spectrometer may comprise a chromatography or other separation device upstream of an ion source. According to an embodiment the chromatography separation device comprises a liquid chromatography or gas chromatography device. According to another embodiment the separation device may comprise: (i) a Capillary Electrophoresis ("CE") separation device; (ii) a Capillary Electrochromatography ("CEC") separation device; (iii) a substantially rigid ceramic-based multilayer microfluidic substrate ("ceramic tile") separation device; or (iv) a supercritical fluid chromatography separation device.

The ion guide is preferably maintained at a pressure selected from the group consisting of: (i) <0.0001 mbar; (ii) 0.0001-0.001 mbar; (iii) 0.001-0.01 mbar; (iv) 0.01-0.1 mbar; (v) 0.1-1 mbar; (vi) 1-10 mbar; (vii) 10-100 mbar; (viii) 100-1000 mbar; and (ix) >1000 mbar.

According to an embodiment analyte ions may be subjected to Electron Transfer Dissociation ("ETD") fragmentation in an Electron Transfer Dissociation fragmentation device. Analyte ions are preferably caused to interact with ETD reagent ions within an ion guide or fragmentation device.

According to an embodiment in order to effect Electron Transfer Dissociation either: (a) analyte ions are fragmented or are induced to dissociate and form product or fragment ions upon interacting with reagent ions; and/or (b) electrons are transferred from one or more reagent anions or negatively charged ions to one or more multiply charged analyte cations or positively charged ions whereupon at least some of the multiply charged analyt cations or positively charged ions are induced to dissociate and form product or fragment ions; and/or (c) analyte ions are fragmented or are induced to dissociate and form product or fragment ions upon interacting with neutral reagent gas molecules or atoms or a non-ionic reagent gas; and/or (d) electrons are transferred from one or more neutral, non-ionic or uncharged basic gases or vapours to one or more multiply charged analyte cations or positively charged ions whereupon at least some of the multiply charged analyte cations or positively charged ions are induced to dissociate and form product or fragment ions; and/or (e) electrons are transferred from one or more neutral, non-ionic or uncharged superbase reagent gases or vapours to one or more multiply charged analyte cations or positively charged ions whereupon at least some of the multiply charge analyte cations or positively charged ions are induced to dissociate and form product or fragment ions; and/or (f) electrons are transferred from one or more neutral, non-ionic or uncharged alkali metal gases or vapours to one or more multiply charged analyte cations or positively charged ions whereupon at least some of the multiply charged analyte cations or positively charged ions are induced to dissociate and form product or fragment ions; and/or (g) electrons are transferred from one or more neutral, non-ionic or uncharged gases, vapours or atoms to one or more multiply charged analyte cations or positively charged ions whereupon at least some of the multiply charged analyte cations or positively charged ions are induced to dissociate and form product or fragment ions, wherein the one or more neutral, non-ionic or uncharged gases, vapours or atoms are selected from the group consisting of: (i) sodium vapour or atoms; (ii) lithium vapour or atoms; (iii) potassium vapour or atoms; (iv) rubidium vapour or atoms; (v) caesium vapour or atoms; (vi) francium vapour or atoms; (vii) $C_{60}$ vapour or atoms; and (viii) magnesium vapour or atoms.

The multiply charged analyte cations or positively charged ions preferably comprise peptides, polypeptides, proteins or biomolecules.

According to an embodiment in order to effect Electron Transfer Dissociation: (a) the reagent anions or negatively charged ions are derived from a polyaromatic hydrocarbon or a substituted polyaromatic hydrocarbon; and/or (b) the reagent anions or negatively charged ions are derived from the group consisting of: (i) anthracene; (ii) 9,10 diphenylanthracene; (iii) naphthalene; (iv) fluorine; (v) phenanthrene; (vi) pyrene; (vii) fluoranthene; (viii) chrysene; (ix) triphenylene; (x) perylene; (xi) acridine; (xii) 2,2' dipyridyl; (xiii) 2,2' biquinoline; (xiv) 9-anthracenecarbonitrile; (xv) dibenzothiophene; (xvi) 1,10'-phenanthroline; (xvii) 9' anthracenecarbonitrile; and (xviii) anthraquinone; and/or (c) the reagent ions or negatively charged ions comprise azobenzene anions or azobenzene radical anions.

According to a particularly preferred embodiment the process of Electron Transfer Dissociation fragmentation comprises interacting analyte ions with reagent ions, wherein the reagent ions comprise dicyanobenzene, 4-nitrotoluene or azulene reagent ions.

BRIEF DESCRIPTION OF THE DRAWINGS

Various embodiments of the present invention will now be described, by way of example only, and with reference to the accompanying drawings in which.

DETAILED DESCRIPTION OF PREFERRED EMBODIMENT

Figure 1:
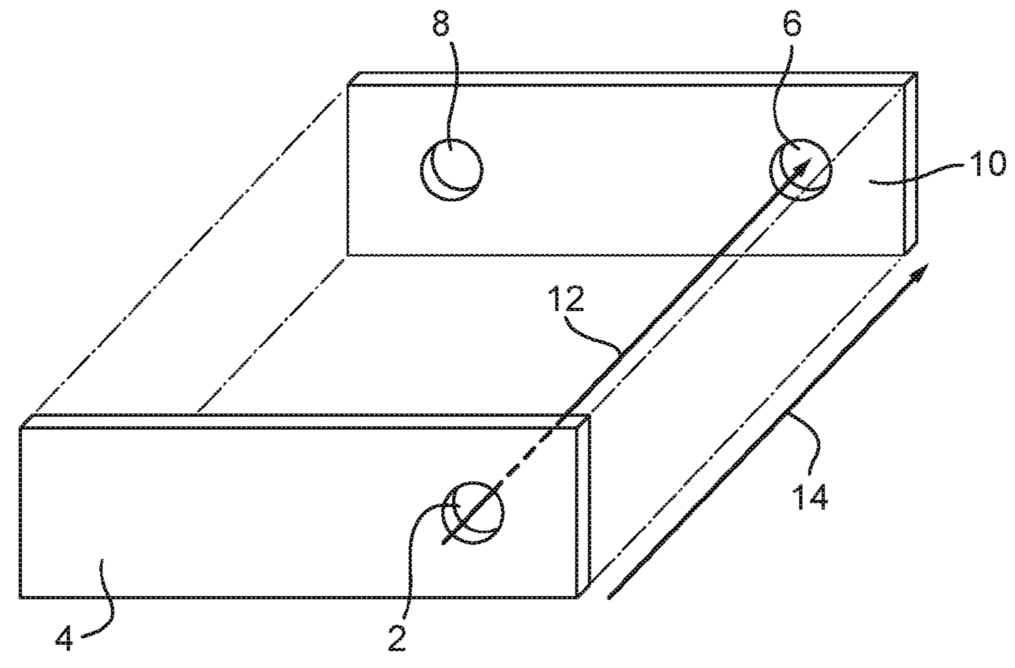
FIG. 1 shows a separation device according to a first embodiment of the present invention operating in a first mode.

FIG. 1 shows a schematic of a separation device according to a preferred embodiment of the present invention. The separation device comprises an ion entrance aperture 2 in the wall 4 of one side of the device, and first and second ion exit apertures 6,8 in the wall 10 on the opposite side of the device. The ion entrance aperture 2 and the first exit aperture 6 are arranged so as to be coaxial, such that ions may pass in a straight line from the ion entrance aperture 2 to the first ion exit aperture 6.

In the first mode of operation shown in FIG. 1, ions pass through the device in a first direction from the ion entrance aperture 2 to the first exit aperture 6. This is illustrated by arrow 12 in FIG. 1. The ions are desirably not separated according to a physicochemical property as they pass from the entrance aperture 2 to the first exit aperture 6. This mode offers an 'off' or 'bypass' state of the separation device. Ions may or may not be driven through the device in the first direction in this mode. Such a driving force is illustrated by arrow 14 in FIG. 1.

However, less preferably, the ions may be separated in the first mode according to a physicochemical property as they pass through the device in the first direction from the ion entrance aperture 2 to the first exit aperture 6. The ions may separate axially along the axis through the entrance aperture 2 and the first exit aperture 6 according to said physicochemical property. The duration of time between any given ion entering the device through the entrance aperture 2 and exiting the device through the first exit aperture 6 may be used to determine the physicochemical property of that ion. Ions may be driven along the axis extending between the entrance aperture 2 and the first exit aperture 6 in this mode. By way of example, in the first mode the device may pulse one or more packets of ions into the entrance aperture 2. The ions in each packet may then separate according to their ion mobility through a gas that is present in the device between the entrance aperture 2 and first exit aperture 6. The ions may be driven through the gas by applying electrical potentials to the device, such as by applying a static voltage gradient between the entrance aperture 2 and the first exit aperture 6.

Figure 2A:
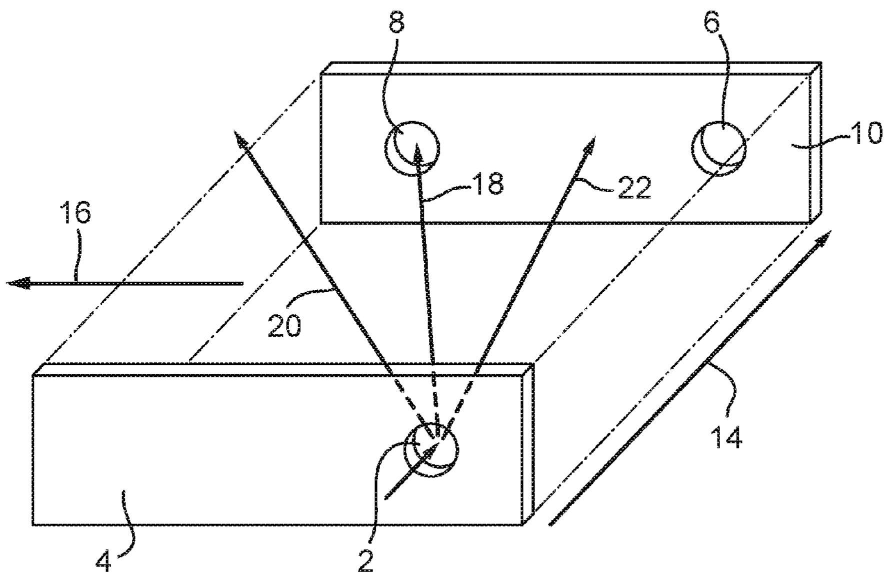
FIGS. 2A and 2B shows the separation device of FIG. 1 operating in a second mode.

FIG. 2A shows the device of FIG. 1 when being operated in a second mode of operation. According to this mode of operation a separation force 16 is applied to the ions in a second direction that extends in a direction from the first exit aperture 6 to the second exit aperture 8, as the ions pass through the device in the first direction (i.e. pass from the entrance aperture 2 towards the exit apertures 6,8). This causes the ions to separate in the second direction according to a physicochemical property as they pass through the device. Preferentially, the driving force is simultaneously applied so as to drive the ions in the first direction.

Ions are transmitted from the entrance aperture 2 in the first side 4 of the device to the second side 10 of the device. Ions which have been driven by said separation force 16 in the second direction to the location of the second exit aperture 8 at the time that these ions reach the second side 10 of the device are able to leave the device through the second exit aperture 8. These ions are illustrated by arrow 18 in FIG. 2A. Other ions are not able to leave the device. These ions are illustrated by arrows 20 and 22 in FIG. 2A. Accordingly, the type of ions that exit the device through the second exit aperture 8 will depend upon the magnitude of the separation force 16 applied in the second direction. As the driving force 14 in the first direction is also preferentially applied in the second mode, then the type of ions that exit the second exit aperture 8 will also depend upon the magnitude or nature of the driving force 14. It is therefore possible to determine said physicochemical property of ions exiting the second exit aperture 8 from the magnitude of the separation force 16 in the second direction and from the driving force 14.

Figure 2B:
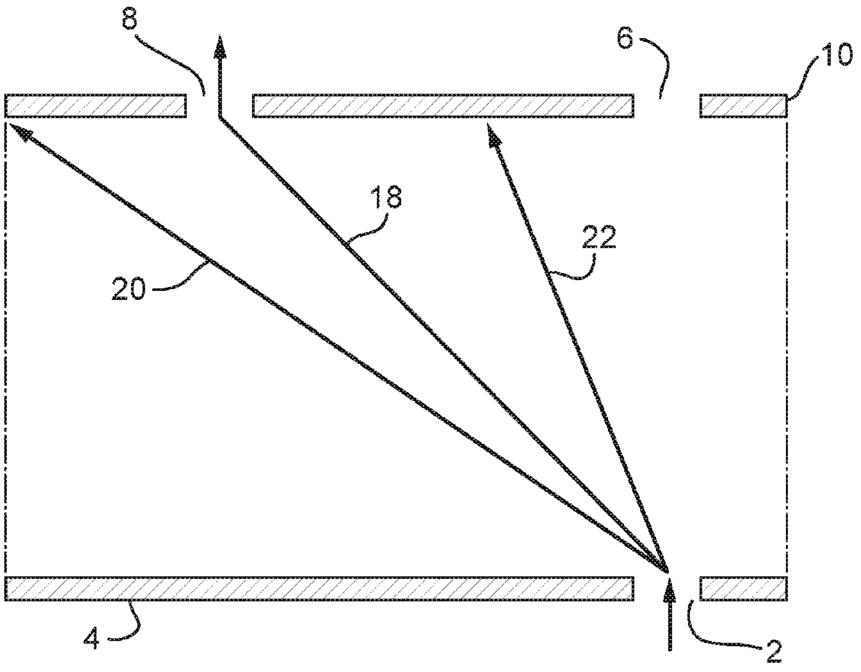

FIG. 2B is a plan view of the embodiment shown in FIG. 2A and illustrates the criteria for transmission of an ion species from the entrance aperture 2 to the second exit aperture 8. It can be assumed that it takes an ion species a time $t_1$ to be transmitted in the first direction from the entrance aperture 2 to the plate 10 containing the second exit aperture 8, under the influence of the driving force 14 in the first direction. It can also be assumed that it takes an ion species a time $t_2$ to be transmitted from the entrance aperture 2 to the second exit aperture 8 in the second direction, under the influence of the separation force 16 in the second direction. For an ion species to be transmitted from the entrance aperture 2 to the exit aperture 8 then $t_1$ and $t_2$ must be equivalent, as shown by the central ion path 18 in FIG. 2B. If the time $t_1$ is not equivalent to time $t_2$ then the ions cannot exit the exit aperture 8, as shown by the leftmost 20 and rightmost 22 ion paths in FIG. 2B.

The magnitude of the driving force 14 in the first direction and/or separation force 16 in the second direction may be varied with time in order to cause ions having different values of said physicochemical property to exit the device through the second exit aperture 8 at different times. The driving force 14 and/or separation force 16 may be scanned with time and the physicochemical property value of the ions detected as exiting the device through the second exit aperture 8 at any given time may be determined from the driving force 14 and/or separation force 16 present at the time that these ions are transmitted through the device.

Figure 3:
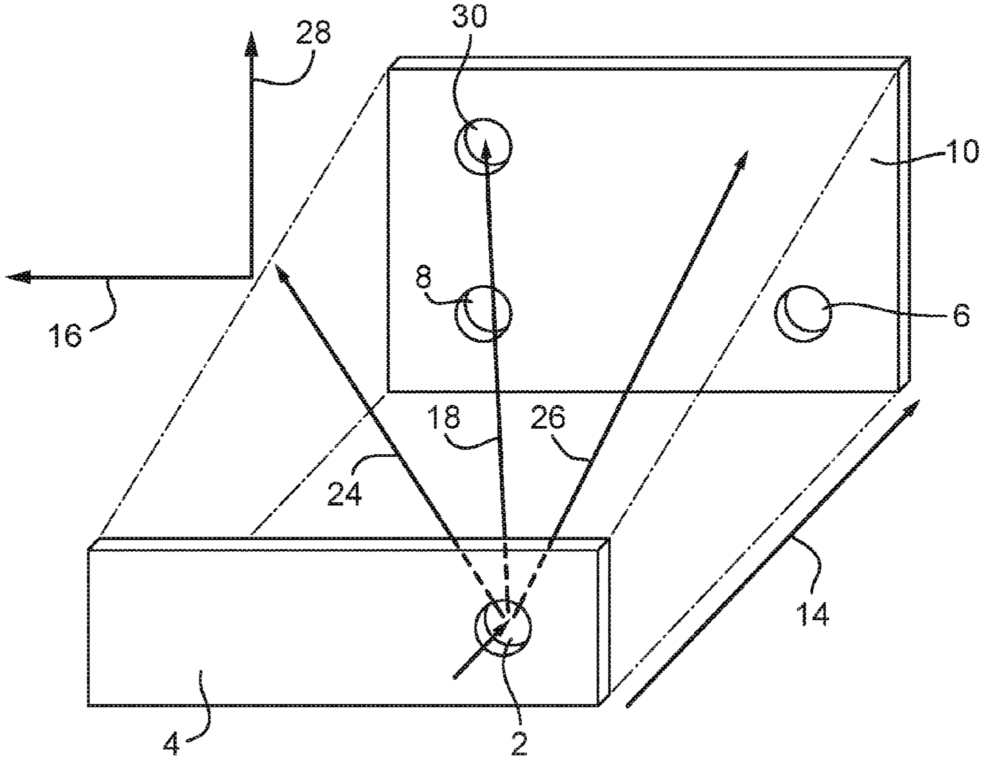
FIG. 3 shows a separation device according to a second embodiment of the present invention.

FIG. 3 shows another embodiment of the present invention that is the same as that of FIGS. 1 and 2, except that a third exit aperture 30 is provided in the second side 10 of the device. The device of FIG. 3 may be operated in the same modes as described above in relation to FIGS. 1 and 2. More specifically, the ions may be transmitted in the first direction from the entrance aperture 2 to the first exit aperture 6. Alternatively, a first separation force 16 may be applied in the second direction so as to cause ions to exit the device through the second exit aperture 8, as described above in relation to FIGS. 2A and 2B. The device of FIG. 3 may be operated in a third mode in which said first separation force 16 is applied in the second direction and a second separation force 28 is also applied in a third direction that extends in a direction from said second exit aperture 8 to said third exit aperture 30. This second separation force 28 causes the ions to separate in the third direction according to a physicochemical property as they pass through the device. Optionally, the driving force 14 of the first mode is simultaneously applied.

Ions are transmitted from the entrance aperture 2 in the first side 4 of the device to the second side 10 of the device. Ions which have been driven by said driving force 14 and said first and second separation forces 16,28 to the location of the third exit aperture 30 at the time that these ions reach the second side 10 of the device are able to leave the device through the third exit aperture 30. Other ions are not able to leave the device. Accordingly, the type of ions that exit the device through the third exit aperture 30 will depend upon the magnitude and nature of the driving force 14 and the first and second separation forces 16,28. It is therefore possible to determine said physicochemical property of ions exiting the third exit aperture 30 from the driving force 14, first separation force 16 and second separation force 28.

According to this embodiment, in order for an ion to be transmitted from the entrance aperture 2 to the third exit aperture 30, the time it takes for the ion to be transmitted from the entrance aperture 2 to the third exit aperture 30 in the third direction under the influence of the second separation force 28 in the third direction must be equivalent to $t_1$ and $t_2$ described above in relation to FIG. 2B.

The first separation force 16 and the second separation force 28 optionally separate the ions according to different physicochemical properties, or may separate the ions at different rates according to the same physicochemical property. For example, the first separation force 16 may separate the ions according to low electric field ion mobility and the second separation force 28 may separate the ions according to high electric field ion mobility. The driving force 14 may also separate the ions according to the same physicochemical property as one or both of the separation forces 16,28, or by a different physicochemical property. However, it is preferred that the driving force 14 does not separate the ions. For example, the driving force 14 may be generated by a gas flow or a DC potential that moves along the device in the first direction so as to drive the ions in the first direction.

The magnitude (or other property) of the driving force 14 in the first direction and/or first separation force 16 in the second direction and/or second separation force 28 in the third direction may be varied with time in order to cause ions having different values of said physicochemical property (or physicochemical properties) to exit the device through the third exit aperture 30 at different times. The driving force 14 and/or first separation force 16 and/or second separation force 28 may be scanned with time and the physicochemical property value (or values of the different physicochemical properties) of the ions detected as exiting the device through the third exit aperture 30 at any given time may be determined from the driving force 14 and/or first separation force 16 and/or second separation force 28 present at the time that these ions are transmitted through the device.

In any of the above embodiments, the driving force 14 and/or first separation force 16 and/or second separation force 28 may be varied in time so as to provide sequential selection of ion species exiting the device, for example, for full spectrum analysis or to synchronise with subsequent analytical analyses.

In any of the above embodiments, the driving force 14 may or may not cause the ions to disperse or separate according to any physicochemical property. For example, the driving force may be provided by a gas flow in the first direction or by travelling a potential barrier (e.g. DC barrier) along the device in the first direction that urges the ions through the device in the first direction. Such techniques may be used so as not to encourage dispersion of the ions in the first direction. Alternatively, the ions can be caused to disperse in the first direction, for example, by applying a DC potential gradient in the first direction.

In any of the above embodiments, the physicochemical property that the ions are separated by may be ion mobility. The driving force 14 and/or first separation force 16 and/or second separation force 28 may provide ion mobility separation. For example, the driving force 14 and/or first separation force 16 and/or second separation force 28 may provide low electric field ion mobility separation, high electric field ion mobility separation, differential mobility separation (DMS), or ion mobility separation by driving the ions through a gas using a potential barrier (e.g. DC barrier) that is travelled along the device. As described above in relation to the third mode of operation, different separation techniques may be used to separate the ions in the second and third directions (and less preferably the first direction).

In any of the above embodiments, the physicochemical property by which ions are separated (in one or more of the directions) may be mass to charge ratio. The driving force 14 and/or first separation force 16 and/or second separation force 28 may provide separation according to mass to charge ratio.

Desirably, the driving force 14 and/or first separation force 16 and/or second separation force 28 separate ions according to different physicochemical properties.

The driving force 14 and/or first separation force 16 and/or second separation force 28 may be provided by time and/or spatially varying electric fields.

The driving force 14 and/or first separation force 16 and/or second separation force 28 may result in different functional dependencies of a physicochemical property in both space and/or time.

For example, as described above in relation to FIG. 2B, the condition for ion transmission is that the transit times in the first and second directions must be equivalent for transmission through the second exit orifice 8. In the simplest case, the force 14 in the first direction will be non-separative and the transit time will be a constant, A, for all species, i.e. $t_1=A$. If the separative force 16 in the second direction is, for example, low field drift tube ion mobility then $t_2=L/(KE)$, where L is the distance between the entrance aperture 2 and second exit aperture 8 in the second direction, E is the electric field strength in the second direction and K is the mobility value of the ion. Consequently, for transmission, an ion species must have a mobility, $K=L/(AE)$. Operating with different values of A or E will transmit different ion species through the second exit aperture 8.

In more selective modes of operation, for example, the force 14 in the first direction will also be separative, such that $t_1$ is a function of a physicochemical property, P. Then $t_1=fn(P)$ and for transmission of ion species i, its mobility $K_i$ must equal $L/(fn(P_i).E)$. The ions can be separated in the two directions by different physicochemical properties or they can be separated by the same property but with different temporal and/or spatial functional dependence as a consequence of the nature of the applied separation forces. For example, ions may be separated in one direction by low field drift tube ion mobility in which the separation time $t\propto 1/K$, whereas ions may be separated in another direction by travelling wave ion mobility separation in which the separation time $t\propto 1/K^2$. The device may be constructed from RF ion guides or surfaces to ensure minimal ion losses in dimensions where ion separation is not occurring. For example, in the arrangements shown in FIGS. 1 and 2 electrodes may be arranged above and below the device and RF voltages may be applied to such electrodes so as to confine ions within the device in a direction between the top and bottom of the device.

Preferably, the device is operated at sub-atmospheric pressure.

The device can be arranged such that the driving and separating force(s) can be in any combination of orthogonal directions within the device.

Ion delivery into the device may be continuous or discontinuous, for example by trapping and then releasing ions into the device.

In less desired methods, initially no driving force is employed in the first direction and ions are injected in a pulsed packet through the entrance aperture and their distance of penetration into the device in said first direction prior to cooling is dependent on a physicochemical property, thereby providing spatially separated ion species. Subsequently, the driving force in the first direction may be activated, in conjunction with one or both of the orthogonal separating forces in the second and/or third directions so as to cause the spatially separated ions to be ejected from the device. Alternatively, the driving force could be continually operated but at a sufficiently low magnitude such that when ion separation is occurring in the first direction the driving force urges ions through the device in the first direction in a transit time that is longer than the time required for the spatial separation in the first direction to establish.

In less preferred methods, initially no driving force is employed in the first direction and ions are injected in a pulsed packet through the entrance aperture with sufficiently high energy to induce ion fragmentation and the distance of penetration into the device in said first direction prior to cooling is dependent on physicochemical properties of the precursor and fragment ions, thereby providing spatially separated ion species. Subsequently, the driving force in the first direction could be activated, in conjunction with one or both of the orthogonal separating forces so as to cause the spatially separated ions to be ejected from the device. Alternatively, the driving force could be continually operated but at a sufficiently low magnitude such that when ion separation in the first direction is occurring the driving force urges ions through the device in the first direction in a transit time that is longer than the time required for the spatial separation in the first direction to establish. This mode of operation provides separation both in 'time or position-of-birth' of fragment ions and their mobility.

Although the present invention has been described with reference to preferred embodiments, it will be understood by those skilled in the art that various changes in form and detail may be made without departing from the scope of the invention as set forth in the accompanying claims.

For example, although the various driving and separation forces have been described as being applied in orthogonal directions, these forces may be applied at other angles to each other.

The invention claimed is:

1. An ion separation device configured to operate at sub-ambient gas pressure comprising:

an ion entrance aperture having an axis therethrough that extends in a first direction, and an ion exit aperture; wherein the entrance aperture and exit aperture are spatially separated from each other in the first direction and in a second, orthogonal direction;

means for urging ions through the device in said first direction; and means for urging ions in said second direction for causing ions to separate in said second direction according to a first physicochemical property such that ions having a first value, or first range of values, of the physicochemical property exit the device through the exit aperture and other ions having a different value, or different range of values, of said physicochemical property do not exit the device through the exit aperture.

2. The device of claim 1, wherein said sub-ambient gas pressure is a pressure lower than atmospheric pressure and is also selected from the group consisting of: $\geq 10^{-4}$ mbar; $\geq 5\times10^{-4}$ mbar; $\geq 10^{-3}$ mbar; $\geq 5\times10^{-3}$ mbar; $\geq 10^{-2}$ mbar; between $10^{-4}$ mbar and $10^{-1}$ mbar; between $10^{-4}$ mbar and $10^{-2}$ mbar; $\leq 10^{-1}$ mbar; $\leq 5\times10^{-2}$ mbar; $\leq 10^{-2}$ mbar; $\leq 5\times10^{-3}$ mbar; and $\leq 10^{-3}$ mbar.

3. The device of claim 1, wherein the device is configured such that there is substantially no gas flow through the device; and/or such that ions are not driven through the device by a gas flow.

4. The device of claim 1, comprising one or more RF voltage supply arranged and configured so as to apply RF voltages to the device so as to confine ions within the device in at least one dimension.

5. The device of claim 1, wherein ions having different first physicochemical property values are driven in the second direction at different rates.

6. The device of claim 1, wherein different ions are caused to travel in said first and/or second directions at different rates such that said ions having said first physicochemical property value(s) arrive at and pass through the exit aperture, whereas ions having said different physicochemical property value(s) do not arrive at the exit aperture.

7. The device of claim 1, comprising means for confining ions in said device in a third direction that is orthogonal to said first and second directions by applying RF and/or DC voltages to said device.

8. The device of claim 1, wherein the entrance aperture is spaced from the exit aperture in the first direction, in the second direction and in a third direction that is orthogonal to both said first and second directions;

wherein the device comprises means for urging ions within the device in the third direction; and (i) wherein, in use, said means for urging ions in the third direction causes ions to separate in said third direction according to a second, different physicochemical property such that ions having a first value, or first range of values, of the second physicochemical property exit the device through the exit aperture and other ions having a different value, or different range of values, of said second physicochemical property do not exit the device through the exit aperture; or (ii) wherein, in use, said means for urging ions in the second and third directions both cause ions to separate according to the same, first physicochemical property but at different rates and such that ions having a first value, or first range of values, of the first physicochemical property exit the device through the exit aperture and other ions having a different value, or different range of values, of said first physicochemical property do not exit the device through the exit aperture.

9. The device of claim 8, further comprising means for urging ions through the device in said first direction, wherein said means for urging ions in said first direction, said means for urging ions in said second direction and said means for urging ions in said third direction either:

(i) cause ions having a first combination of values for said first and second physicochemical properties to exit the device through the exit aperture and other ions having a second, different combination of values for said first and second physicochemical properties not to exit the device through the exit aperture; or (ii) cause ions having a first value or first range of values of the first physicochemical property to exit the device through the exit aperture and other ions having a different value or different range of values of said first physicochemical property not to exit the device through the exit aperture.

10. The device of claim 8, wherein different types of ions are caused to travel in said first and/or second and/or third directions at different rates such that some of said ions arrive at and pass through the exit aperture, whereas other, different types of ions do not arrive at the exit orifice.

11. The device of claim 1, wherein the device is configured such that ions are simultaneously separated in the first and second directions, or in the second and third directions, or in all of the first, second and third direction.

12. The device of claim 1, wherein the exit aperture is arranged in a wall of the device such that ions that are not transmitted through the exit aperture collide with said wall.

13. The device of claim 1, comprising control means for varying the force with which ions are urged in the first and/or second and/or third directions with time such that ions having different values of said first and/or second physicochemical property exit a given exit aperture at different times.

14. The device of claim 1, wherein said device comprises a further exit aperture that is coaxial with the entrance aperture for allowing ions to pass from the entrance aperture to the further exit aperture in a substantially straight line.

15. The device of claim 1, wherein the device comprises multiple exit apertures that are spaced apart from the entrance aperture in the first direction, and:

i) wherein the multiple exit apertures are spaced apart from the entrance aperture by different distances in the second direction: and/or ii) wherein the multiple exit apertures are spaced apart from the entrance aperture by different distances in the third direction orthogonal to said first and second directions; and/or iii) wherein at least one of the multiple exit apertures is spaced apart from the entrance aperture in the second direction and at least one other of the multiple exit apertures is spaced apart from the entrance aperture in the third direction.

16. The device of claim 15, comprising control means for varying the force with which ions are urged in the first and/or second and/or third directions with time such that ions having the same value of said first and/or second physicochemical property exit different exit apertures at different times.

17. The device of claim 1, wherein said first physicochemical property is ion mobility and ions separate in the first and/or second and/or third direction according to their ion mobility; or wherein the ions are separated in the first and/or second and/or third directions according to different separation techniques, said different separation techniques optionally being selected from the list consisting of: low electric field ion mobility separation; high electric field ion mobility separation; differential mobility separation; and ion mobility separation by driving the ions through a gas using a potential barrier.

18. The device of claim 1, comprising means for driving ions in the first direction by travelling one or more DC voltage in the first direction.

19. An ion mobility spectrometer or a mass spectrometer comprising a device as claimed in claim 1.

20. A method of separating ions at sub-ambient gas pressure using an ion separation device configured to operate at sub-ambient gas pressure including an ion entrance aperture having an axis therethrough that extends in a first direction, and an ion exit aperture; wherein the entrance aperture and exit aperture are spatially separated from each other in the first direction and in a second, orthogonal direction, said method comprising urging ions in said first direction, and urging ions in said second direction as the ions travel in the first direction such that ions separate in said second direction according to a physicochemical property and so that ions having a first value, or first range of values, of the physicochemical property exit the device through the exit aperture and other ions having a different value, or different range of values, of said physicochemical property do not exit the device through the exit aperture.

21. A method of ion mobility spectrometry or mass spectrometry comprising a method as claimed in claim 20.

* * * * *